United States Patent
Etschmaier et al.

(10) Patent No.: US 11,675,049 B2
(45) Date of Patent: Jun. 13, 2023

(54) METHOD FOR FABRICATING A PLURALITY OF TIME-OF-FLIGHT SENSOR DEVICES

(71) Applicant: ams AG, Premstaetten (AT)

(72) Inventors: Harald Etschmaier, Premstaetten (AT); Thomas Bodner, Premstaetten (AT)

(73) Assignee: ams AG, Premstaetten (AT)

( * ) Notice: Subject to any disclaimer, the term of this patent is extended or adjusted under 35 U.S.C. 154(b) by 571 days.

(21) Appl. No.: 16/754,335

(22) PCT Filed: Oct. 10, 2018

(86) PCT No.: PCT/EP2018/077626
§ 371 (c)(1),
(2) Date: Apr. 7, 2020

(87) PCT Pub. No.: WO2019/072927
PCT Pub. Date: Apr. 18, 2019

(65) Prior Publication Data
US 2020/0333442 A1    Oct. 22, 2020

(30) Foreign Application Priority Data

Oct. 12, 2017    (EP) .................................... 17196120

(51) Int. Cl.
*G01S 7/481*    (2006.01)
*G01S 17/10*    (2020.01)
(Continued)

(52) U.S. Cl.
CPC .......... *G01S 7/4813* (2013.01); *G01S 7/4808* (2013.01); *G01S 7/4865* (2013.01); *G01S 17/10* (2013.01);
(Continued)

(58) Field of Classification Search
CPC .... G01S 7/4813; G01S 7/4808; G01S 7/4865; G01S 17/10; H01L 31/0203; H01L 31/02325; H01L 31/173; H01L 31/1876
See application file for complete search history.

(56) References Cited

U.S. PATENT DOCUMENTS

| 8,716,739 B2 | 5/2014 | Coffy et al. |
| 9,136,292 B2 | 9/2015 | Coffy et al. |
| (Continued) | | |

FOREIGN PATENT DOCUMENTS

| CN | 105849892 A | 8/2016 |
| WO | 2015088443 A1 | 6/2015 |
| WO | 2017/142487 | 8/2017 |

OTHER PUBLICATIONS

European Patent Office, International Search Report for PCT/EP2018/077626 dated Dec. 7, 2018.
(Continued)

*Primary Examiner* — Seung C Sohn
(74) *Attorney, Agent, or Firm* — MH2 Technology Law Group, LLP

(57) ABSTRACT

A method for fabricating a plurality of Time-of-Flight sensor devices (1) comprises a step of providing a wafer (100) including a plurality of wafer portions (110) for a respective one of the Time-of-Flight sensor devices (1), wherein each of the wafer portions (110) includes a first light detecting area (10) and a second light detecting area (20) and a respective light emitter device (30). The respective light emitter device (30) and the respective first light detecting area (10) is encapsulated by a first volume (40) of a light transparent material (130), and the respective second light detecting area (20) is encapsulated by a second volume (50) of the light transparent material (130). Before singulation of the devices (1), an opaque material (60) is placed on the
(Continued)

wafer portions (110) in a space (120) between the respective first and second volume (40, 50) of the light transparent material (130).

12 Claims, 4 Drawing Sheets

(51) Int. Cl.
    *H01L 31/0203*     (2014.01)
    *H01L 31/0232*     (2014.01)
    *H01L 31/173*     (2006.01)
    *H01L 31/18*     (2006.01)
    *G01S 7/48*     (2006.01)
    *G01S 7/4865*     (2020.01)

(52) U.S. Cl.
    CPC .... *H01L 31/0203* (2013.01); *H01L 31/02325* (2013.01); *H01L 31/173* (2013.01); *H01L 31/1876* (2013.01)

(56) References Cited

U.S. PATENT DOCUMENTS

| | | | |
|---|---|---|---|
| 10,940,788 B2* | 3/2021 | Al-Dahle | G01S 17/26 |
| 11,088,127 B2* | 8/2021 | Last | H01S 5/0237 |
| 2013/0099101 A1 | 4/2013 | Campbell | |
| 2013/0153933 A1 | 6/2013 | Lee et al. | |
| 2013/0334445 A1 | 12/2013 | Tharumalingam et al. | |
| 2014/0042305 A1 | 2/2014 | Liu | |
| 2015/0083900 A1 | 3/2015 | Caley et al. | |
| 2017/0287886 A1 | 10/2017 | Gani | |
| 2020/0271765 A1* | 8/2020 | Glover | G01S 7/497 |
| 2020/0300989 A1* | 9/2020 | Glover | G01S 7/4865 |

OTHER PUBLICATIONS

Shen, Changyu (CN AdminisliaLion), Chinese Patent Certificate of Invention in Chinese Patent No. ZL201880055865.4 dated Nov. 4, 2022, 3 pages.

* cited by examiner

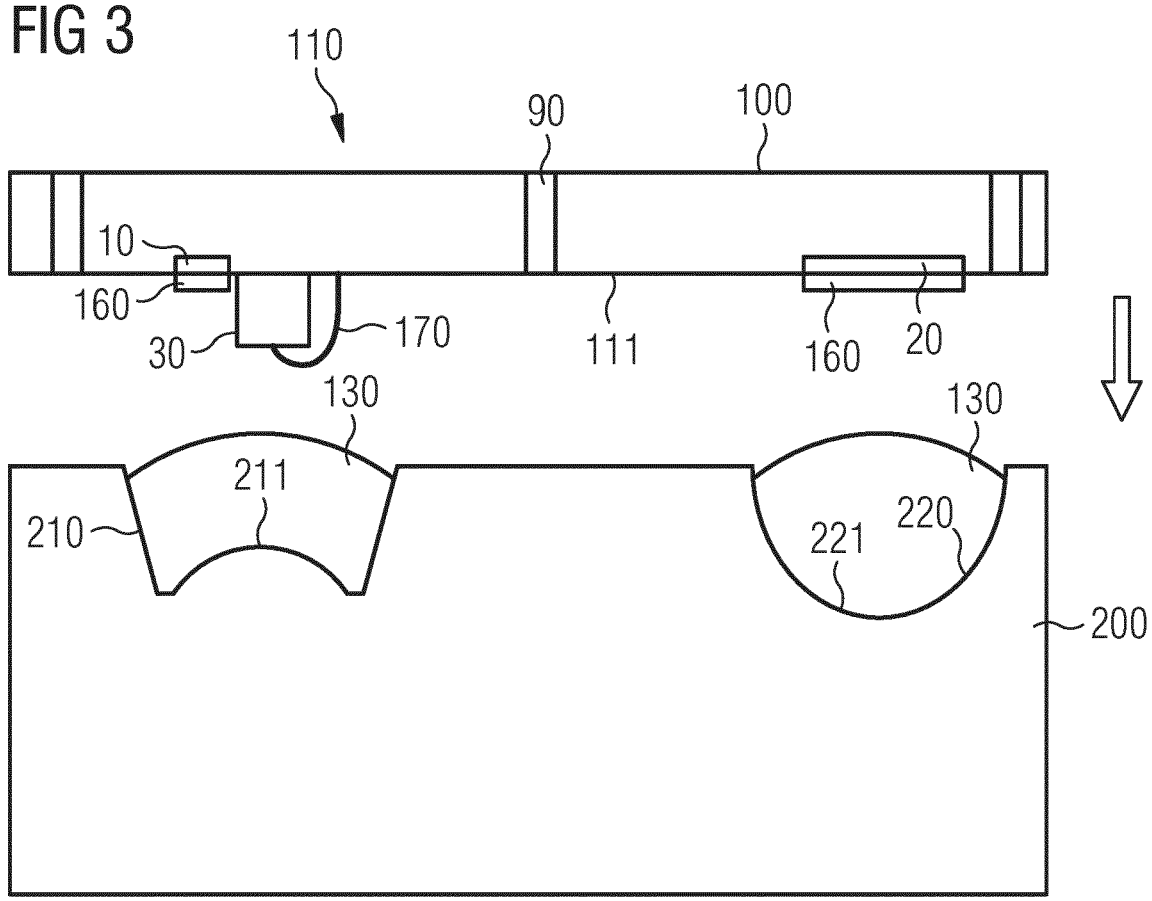
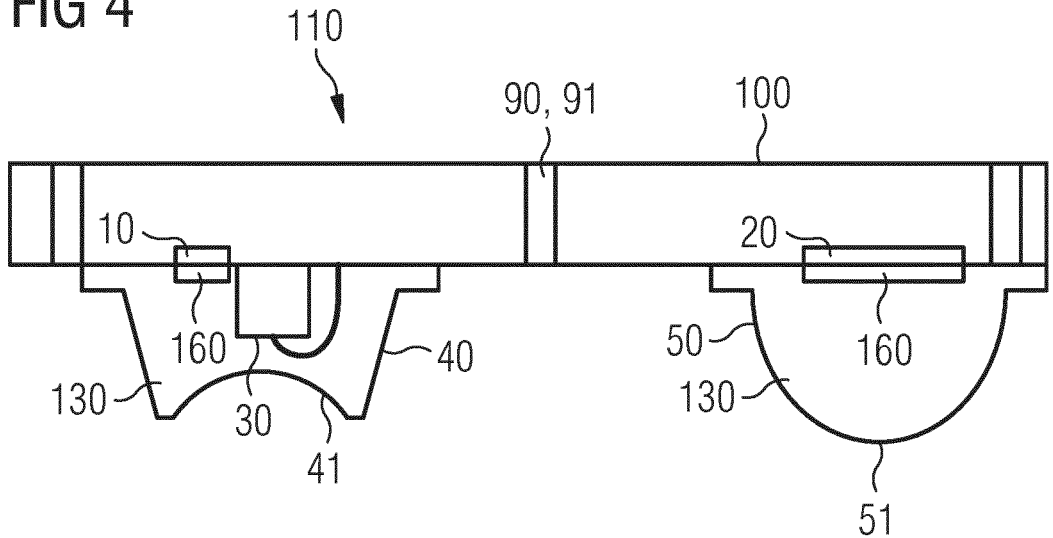

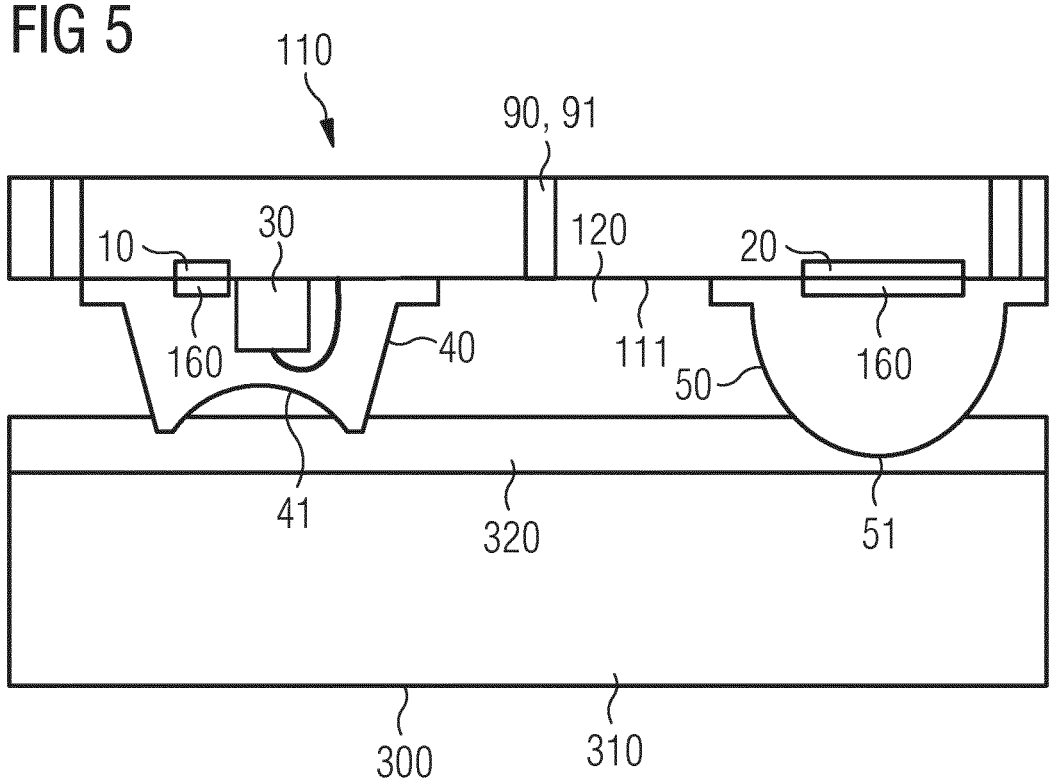
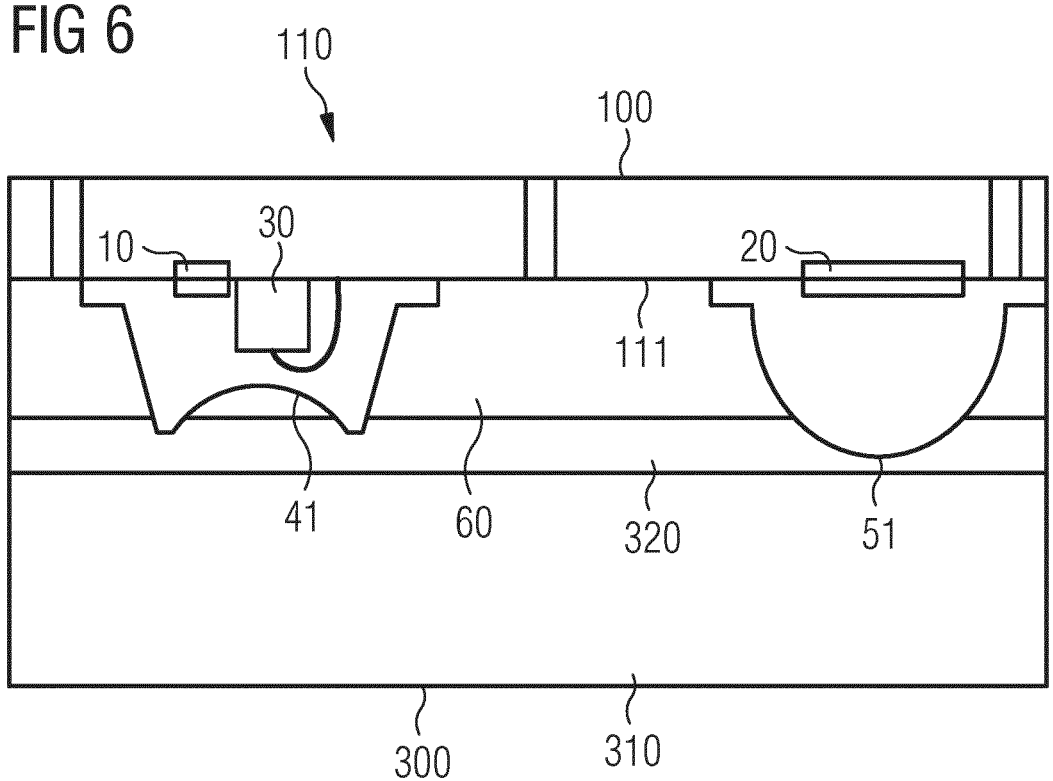

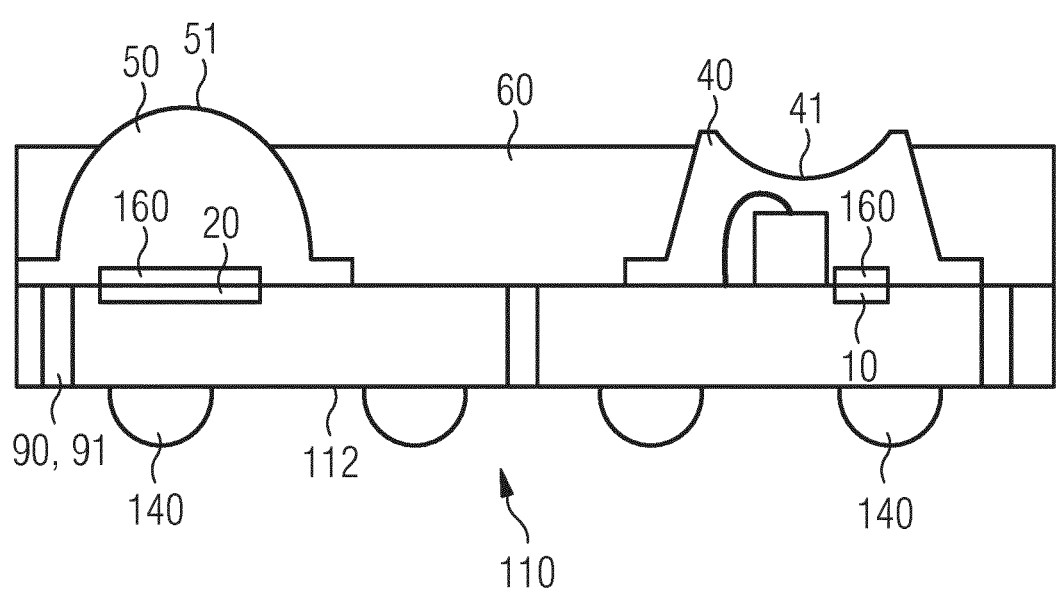

METHOD FOR FABRICATING A PLURALITY OF TIME-OF-FLIGHT SENSOR DEVICES

TECHNICAL FIELD

The disclosure relates to a method for fabricating a plurality of Time-of-Flight sensor devices. The disclosure further relates to a Time-of-Flight sensor device fabricated by the method.

BACKGROUND

Time-of-Flight (TOF) distance measurement is based on measuring the time duration between two events, such as when a signal leaves a range finder and when it is received again after reflection at a target. The time between the event of emitting the signal and the event of receiving the reflected signal is directly proportional to the distance between the range finder and the target. The precision of the distance measurement is directly proportional to the precision of the time measurement.

There is a desire to provide a method for fabricating a plurality of Time-of-Flight sensor devices, wherein the method enables to produce a large number of devices in a short time with a low number of processing steps.

SUMMARY

An embodiment of a method for fabricating a plurality of Time-of-Flight sensor devices is specified in claim 1.

According to the method for fabrication the plurality of Time-of-Flight sensor devices, a wafer is provided, wherein said wafer includes a plurality of wafer portions for a respective one of the Time-of-Flight sensor devices. Each of the wafer portions includes a first light detecting area and a second light detecting area, wherein at least the second light detecting area is arranged in a surface of the respective wafer portion.

A respective light emitter device is disposed on each of the wafer portions. The respective light emitter device and the respective first light detecting area are arranged so that portions of the light emitted by the respective light emitter device are detected by the respective first light detecting area. The respective light emitter device and the respective first light detecting area are encapsulated by a first volume of a light transparent material. The respective second light detecting area is encapsulated by a second volume of the light transparent material. The first and the second volume of the light transparent material are separated from each other. An opaque material is placed on the wafer portions in a space between the respective first and second volume of the light transparent material. The wafer is diced between adjacent ones of the wafer portions to separate the wafer into the plurality of the Time-of-Flight sensor devices.

The method allows to produce a wafer level package for a TOF sensor system. In particular, the method and the Time-of-Flight sensor device manufactured by the method provide an optical reference path, which is necessary for a functional TOF sensor system, on wafer level, instead of relying on an electronic signal for starting a timer. The optical reference path is provided between the light emitter device and the first light detecting area. The first light detecting area is disposed close to the light emitter device so that scattered light emitted from the light emitter device is received from the first light detecting area.

The optical reference path between the light emitter device and the first light detecting area allows to improve accuracy of the time measurement, because an electronic signal for starting a timer when a light signal is emitted from the light emitter device is not necessary. The timer which starts to count when light is emitted from the light emitter device is started when the scattered light of the light emitter device is received from the first light detecting area via the optical reference path.

A vertical cavity surface-emitting laser (VCSEL) may be used as a light emitter device. The first and the second light detecting area may be realized by two single photon avalanche diode (SPAD) arrays on a single die. The first light detecting area serves as a detector for a reference signal, for example, for detecting the scattered light emitted from the light emitter device. When the scattered light is received from the first light detecting area a timer starts to count the time until the signal reflected at a target is received from the second light detecting area.

In order to differentiate between the reference signal received at the first light detecting area and the measurement/reflected signal at the second light detecting area, the light detecting areas have to be optically isolated so that it is ensured that the first light detecting area only receive an optical signal coming directly from the light emitter device, and the second light detecting area receives and detects an optical signal after reflection at the target. To this purpose, the two light detecting areas are optically isolated by the opaque material that serves as an optical barrier between the light emitter device and the second light detecting area.

According to a possible embodiment of the method for fabricating the plurality of Time-of-Flight sensor devices, the respective first and second volume of the light transparent material are provided on the surface of each wafer portion by a Nano Imprint Lithography (NIL) process. An imprint mold having a plurality of pairs of a first and second cavity is provided. The first and the second cavity of each pair of the cavities is filled with the light transparent material. The imprint mold is then placed on a surface of the wafer so that each pair of the first and second cavity, with the light transparent material included, is placed over a respective one of the wafer portions.

In particular, the imprint mold is disposed above the wafer so that the first cavity of each pair of cavities of the imprint mold is placed over the light emitter device and the first light detecting area. The second cavity of each pair of the first and second cavity of the imprint mold is placed above the second light detecting area. Due to the distance between the first and second cavity of the imprint mold the first volume of the light transparent material which has been provided and formed by the first cavity of the imprint mold and the second volume of the light transparent material which has been provided and formed by the transparent material included in the second cavity of the imprint mold are spatially separated from each other.

In order to place the opaque material on the wafer portions in the space between the respective first and second volume of the light transparent material, a wafer-level molding (WLM) process may be used. In particular, the opaque material which forms the optical barrier between the first and the second volume of the light transparent material and thus between the first and the second light detecting area can be made by film assisted wafer-level molding.

In this technology, a body of a mold tool is covered by a soft film, for example a PTFE film and clamped on the wafer surface. The film seals the contact areas between the mold tool and the wafer or the upper surface of the first and second volume of the light transparent material. The film is pressed to the upper surface of the respective first and second volume of the light transparent material of each wafer portion so that the upper surface of the respective first and second volume of the light transparent material is sealed by the film. The opaque material can now be injected in the space between the film and the surface of the wafer portions. The respective upper surface of the first and second volume of the light transparent material of each wafer portion is kept free of the mold compound/opaque material.

Before singulation of the wafer, electrical connections are attached to the backside/lower surface of each wafer portion. The electrical connections may be configured as solder balls. The electrical connections are provided to connect each Time-of-Flight sensor device to a circuit board.

The proposed manufacturing process flow combines the technologies of Nano Imprint Lithography (NIL) and wafer-level molding (WLM). The complete assembly process is carried out on a wafer level prior to singulation. The wafer-level processing reduces assembly costs. The manufacturing method allows to produce a chip scale emitter/receiver package for a Time-of-Flight sensor with a reduced footprint compared to conventional LGA packages. The wafer-level chip scale package for the Time-of-Flight sensor manufactured by the proposed method comprises integrated lenses which improve product performance and offer "multi-zone" functionality. The integrated lenses are formed by the respective first and second volume of the light transparent material of each wafer portion. In particular, the integrated lenses do not only enable a resolution in one direction, for example the z-direction, but also a resolution in other directions, for example the x- and y-direction.

Additional features and advantages are set forth in the detailed description that follows, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

BRIEF DESCRIPTION OF THE DRAWINGS

FIG. 3 illustrates a wafer-level manufacturing step of Nano Imprint lithography in which cavities of an imprint mold are filled with a light transparent material for forming first and second volumes of the light transparent material on wafer portions of a wafer;

FIG. 4 illustrates a wafer-level manufacturing step in which the light transparent material for the first and second volume of the light transparent material is cured;

FIG. 5 illustrates a wafer-level manufacturing step of wafer-level molding in which a mold tool forms a space between a surface of the wafer and a film of the mold tool that covers a respective upper surface of the first and second volume of the light transparent material;

FIG. 6 illustrates a wafer-level manufacturing step of wafer-level molding in which an opaque material is injected in a space between a wafer surface and a film of the mold tool and cured; and FIG. 7 illustrates a wafer-level manufacturing step in which external connections are mounted to a backside of the wafer before the individual wafer portions of the wafer are singulated.

DETAILED DESCRIPTION

Figure 1:
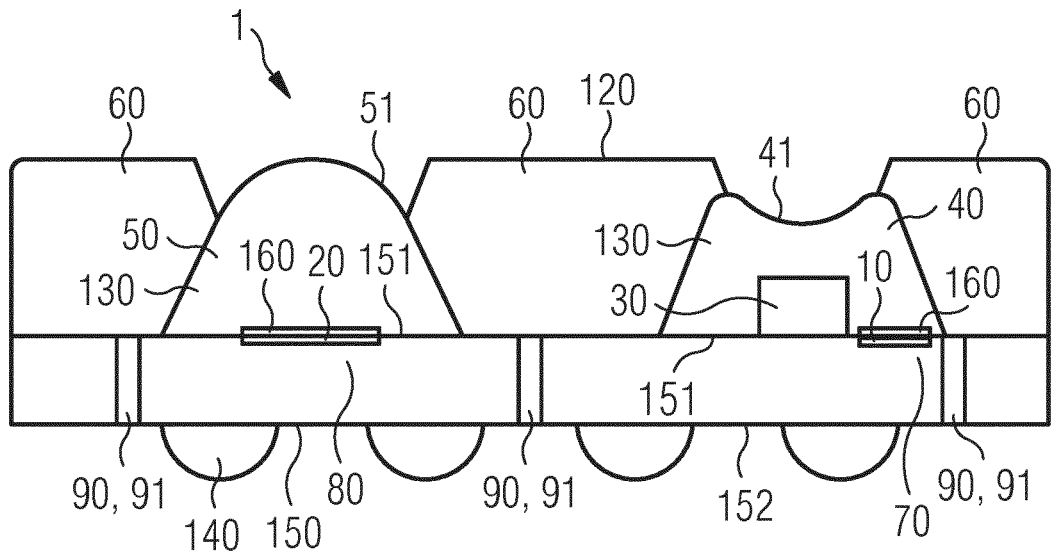
FIG. 1 shows an embodiment of a Time-of-Flight sensor device having a wafer-level chip scale package.

Embodiments of the method for fabricating a plurality of Time-of-Flight sensor devices and a Time-of-Flight sensor device manufactured by the method are now be described more fully hereinafter with reference to the accompanying drawings. The manufacturing method and the Time-of-Flight sensor device may, however, be embodied in many different forms and should not be construed as limited to the embodiments set forth herein; rather, these embodiments are provided so that the disclosure will fully convey the scope of the manufacturing method and the Time-of-Flight sensor device to those skilled in the art. The drawing are not necessarily drawn to scale but are configured to clearly illustrate the different embodiments of the manufacturing method and the Time-of-Flight sensor device.

FIG. 1 shows an embodiment of a Time-of-Flight sensor device 1 having a chip scale emitter/receiver package which is manufactured on wafer level. The Time-of-Flight sensor device 1 comprises a die 150 with at least an integrated circuit on its top surface 151. The die 150 may be configured as a portion, for example a silicon die, that has been singularized from a silicon wafer. The die 150 includes a light detecting area 10 and a light detecting area 20 being arranged in/on the surface 151 of the silicon die 150. The light detecting areas 10 and 20 may be respectively configured as two spatially separated SPAD (single photon avalanche diode) arrays.

The Time-of-Flight sensor device 1 further comprises a light emitter device 30 being arranged on the same surface 151 of the silicon die 150. The light emitter device 30 may be configured as a VCSEL (vertical cavity surface emitting laser). The purpose of the light detecting area 10 is to detect the emission of light emitted by the light emitter device 30. The light detecting area 10 may be configured to detect the emission of a laser pulse, if the light emitter device 30 is embodied to emit laser light pulses. The light detecting area 20 is configured to detect the return of the emitted light after being reflected at a target. In particular, the light detecting area 20 may be configured to detect a reflected laser pulse previously emitted by the light emitter device 30 and being reflected at a target.

The light emitter device 30 is arranged/stacked on the surface 151 of the silicon die 150 in relation to the light detecting area 10 such that portions of the light emitted by the light emitter device 30 are detected by the light detecting area 10. According to a possible embodiment of the Time-of-Flight sensor device, the light emitter device 30 and the light detecting area 10 may be arranged close/next to each other so that the portions of the light emitted by the light emitter device 30 are detected by the light detecting area 10. This embodiment is shown in FIG. 1.

According to another embodiment, the light emitter device 30 and the light detecting area 10 may be arranged on top of each other on the wafer 100 so that the portions of the light emitted by the light emitter device 30 may be detected by the light detecting area 10. In particular, the light emitter device 30 may be arranged on the surface 151 of the silicon die 150 so that the light emitter device 30 covers the light detecting area 10.

Both embodiments ensure a direct light path from the light emitter device 30 to the reference light detecting area 10. The purpose of the light detecting area/array 10 is to detect the time of the emission of light emitted by the light emitter device 30, for example the emission of a laser pulse. The light detecting area 20 is provided to detect the time of the return of the reflected laser pulse previously emitted by the light emitter device 30. One or both of the light detecting areas 10 and 20 may be covered by an optical bandpass filter 160, as shown in FIG. 1. This configuration enables to reduce the effect of ambient light to the light detecting areas 10 and 20. The optical filter 160 may be configured as a structured, dielectric interference filter.

Through silicon vias 90 are provided in the silicon die 150 and filled with an electrically conductive material 91. Electrically contacts are brought from the front surface 151 of the silicon die to the backside 152 of the silicon die by the metallized through silicon vias 90.

The Time-of-Flight sensor device comprises an integrated circuit 70 coupled to the light detecting area 10 to convert an optical signal received from the light detecting area 10 in a first electrical signal. The Time-of-Flight sensor device 1 further comprises an integrated circuit 80 coupled to the light detecting area 20 to convert an optical signal received from the light detecting area 20 in a second electrical signal. The integrated circuits 70 and 80 may be optoelectronic circuits being integrated in the silicon die 150. In order to electrically connect the integrated circuits 70 and 80 external connections 140, for example solder balls, are arranged on the lower surface/backside 152 of the silicon die 150.

The two light detecting areas 10 and 20 are covered by separate volumes 40 and 50 of a light transparent material 130, for example a clear epoxy resin or silicone. A first volume 40 of a light transparent material 130 is placed on the surface 151 of the silicon die 150 so that the light emitter device 30 and the light detecting area 10 are encapsulated by the volume 40 of the light transparent material 130. A second volume 50 of a light transparent material 130 is placed on the surface 151 of the silicon die 150 so that the light detecting area 20 is encapsulated by the volume 40 of the light transparent material. The volumes 40 and 50 of the light transparent material 130 are separated from each other.

The upper/top surfaces 41 and 51 of the volumes 40 and 50 can be shaped to achieve optical functionality. In particular, the surfaces 41 and 51 may be shaped such that the volumes 40 and 50 are embodied as optical lenses. The surface 41 of the volume 40 of the light transparent material 130 may be configured as a concave lens. The lens 40 being arranged over the light emitter device 30 is advantageously of concave shape to widen its field of emission and thus the field of view of the sensor. Regarding the volume 50, it is preferred to form the surface 51 of the volume 50 of the light transparent material 130 such that the volume 50 of the light transparent material is configured as a convex lens. The convex lens on top of the measurement light detecting area 20 serves as an imaging lens, which enables the system to resolve laterally spaced objects.

As shown in FIG. 1, an opaque material 60 is disposed in a space 120 between the volume 40 and 50 of the light transparent material 130 such that the upper surface 41 of the volume 40 of the light transparent material and the upper surface 51 of the volume 50 of the light transparent material 130 is free from the opaque material 60. The remaining portions, i.e. the lower portions of the volume 40 and 50 of the light transparent material 130 are embedded in the opaque material 60. The opaque material 60 serves as an optical barrier to prevent emitted light from the light emitter device 30 directly reaching the measurement light detecting area 20. Only light which has been reflected by another object can reach the measurement light detecting area 20.

In order to create the opaque material, an absorbing additive like carbon black can be added to the transparent material 130, for example an epoxy resin or silicone. Preferably, the opaque material 60 completely surrounds the clear/light transparent material 130 and covers all of the surface 151 of the die 150 that is not covered by the light transparent material 130. Only the top part of the lenses 40 and 50, i.e. the upper surfaces 41 and 51 of the lenses, remain uncovered, as shown in FIG. 1. In this configuration, the opaque material 60 works as an aperture for the lenses 40, 50 and protects the sensitive die surface 151 from environmental stresses FIGS. 2 to 7 illustrate method steps of a manufacturing method to fabricate the Time-of-Flight sensor device 1. All method steps are performed on wafer level so that the individual components of the Time-of-Flight sensor devices do not need to be assembled individually for each unit. Thus, the described manufacturing process is fast and the assembly costs are low. FIGS. 2 to 7 only show one of a plurality of wafer portions 110 to realize one of the Time-of-Flight sensor devices.

Figure 2:
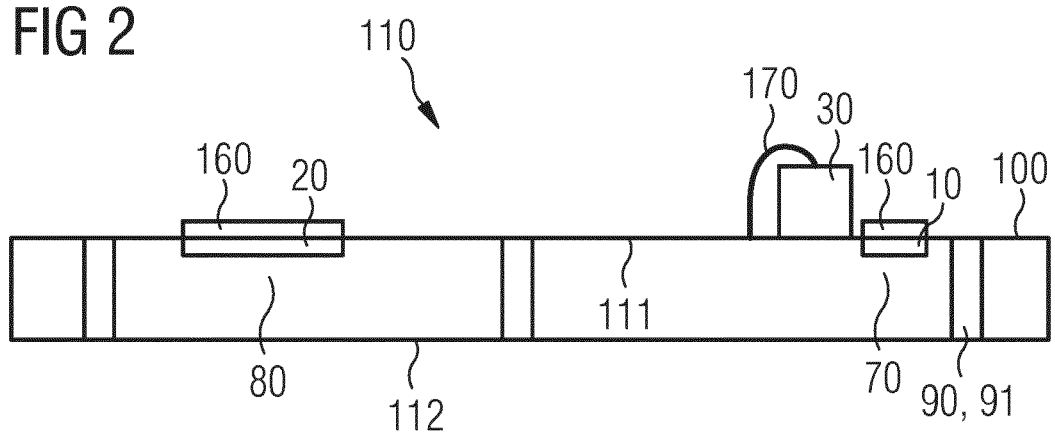
FIG. 2 illustrates an arrangement of a light emitter device and light detecting areas on a silicon wafer for fabricating a Time-of-Flight sensor device.

FIG. 2 illustrates a manufacturing step for fabricating a plurality of Time-of-Flight sensor devices, wherein a wafer 100 including a plurality of wafer portions 110 for a respective one of the Time-of-Flight sensor devices 1 is provided. Each of the wafer portions 110 includes a light detecting area 10 and a light detecting area 20 being arranged in/on a surface 111 of the respective wafer portion 110.

The wafer 100 is made of a silicon material. Each of the wafer portions 110 of the wafer 100 includes a respective integrated circuit 70 coupled to the respective light detecting area 10 to convert an optical signal of the light detecting area 10 in an electrical signal. Furthermore, each of the wafer portions 110 of the wafer 100 includes a respective integrated circuit 80 coupled to the respective light detecting area 20 to convert an optical signal of the light detecting area 20 into an electrical signal. The integrated circuits 70 and 80 may be configured as optoelectronic circuits which are integrated in each of the wafer portions 110.

A respective light emitter device 30 is disposed on each of the wafer portions 110. As explained above, the light emitter device 30 may be configured as a VCSEL to emit light, for example laser pulses, to a target. The stacking of the light emitter device 30, for example the VCSEL, is done on wafer level to maximize efficiency. The light emitter device 30 may be used in various contact configurations. The light emitter devices, for example the VCSELs, are available in various contact configurations: double top contact, top and bottom contact or double bottom contact. For top contacts the electrical connection to the circuitry on the chip is made by wire bonding, whereas in the case of the light emitter device 30 having bottom contacts, the bottom contacts may be soldered or glued to the surface 151 of the silicon die 150.

A die bonder can be used to attach the light emitter device 30 to the surface 111 of each of the wafer portions 110 of the wafer 100. As shown in FIG. 2, the top surface of the light emitter device 30 may be electrically connected to the surface 111 of each of the wafer portions 110 by a wire 170 which is set with a wire bonder. For bottom contact light emitter devices 30, it is sufficient to establish the electrical connection by an electrically conductive glue or solder which connects the bottom surface of the light emitter device 30 to the surface 111 of the respective wafer portion 110 of the wafer 100.

The light emitter device 30 is configured to emit light to a target that reflects the light. The light detecting area 10 receives the light directly emitted from the light emitter device 30. The reflected light is received by the light detecting area 20. In order to determine a distance between the Time-of-Flight sensor device and the target, the time duration between the emission of the light and the receiving of the reflected light is determined.

The respective light emitter device 30 and the respective light detecting area 10 are arranged on the surface 111 of the wafer portion 110 so that portions of the light emitted by the respective light emitter device 30 are detected by the respective light detecting area 10 via a direct optical path.

In order to provide the optical path to directly receive the light emitted by the light emitter device 30, for example scattered light of the light emitter device 30, the respective light emitter device 30 and the respective light detecting area 10 of each wafer portion 110 are arranged close/next to each other, as shown in FIG. 2.

According to another configuration, the respective light emitter device 30 and the respective light detecting area 10 of each wafer portion 110 are arranged on top of each other so that portions of the light emitted by the respective light emitter device 30 are detected by the respective light detecting area 10 of each of the wafer portions 110. The respective light emitter device 30 may be arranged, for example, above the respective light detecting area 10 to cover the respective light detecting area 10 of each of the wafer portions 110.

As illustrated in FIG. 2, according to a possible embodiment, one or both of the light detecting areas 10 and 20 may be covered by an optical filter 160, for example an optical bandpass filter, in order to reduce the effect of ambient light.

Respective through silicon vias 90 which are filled with an electrically conductive material 91 may be provided in the material of each of the wafer portions 110 to provide an electrical connection from the surface/upper side 111 of each of the wafer portions to the backside 112 of each of the wafer portions 110.

The volumes 40 and 50 of the light transparent material 130 are provided on the surface 111 of each of the wafer portions 110 by a Nano Imprint lithography (NIL) process. The NIL-process is illustrated in FIGS. 3 and 4. In particular, FIGS. 3 and 4 illustrate the manufacturing step of encapsulating the respective light emitter device 30 and the respective light detecting area 10 of each of the wafer portions 110 by the volume 40 of the light transparent material 130, and the step of encapsulating the respective light detecting area 20 by the volume 50 of the light transparent material 130, wherein the volumes 40 and 50 of the light transparent material are separated from each other.

As shown in FIG. 3, an imprint mold/master stamp 200 having a plurality of pairs of a first and a second cavity 210, 220 is provided. Each pair of the first and the second cavity 210, 220 is associated with a respective one of the wafer portions 110 or Time-of-Flight sensor devices 1.

The imprint mold/master 200 can be made from UV-transparent materials such as PMMA or PDMS. The first and the second cavity 210, 220 of each pair of the first and the second cavity is filled with the light transparent material 130. In particular, in the cavities 210, 220, a clear, UV or heat-curable compound can be dispensed. Then, the imprint mold 200 is brought in contact with the surface 111 of each of the wafer portions 110. In particular, the imprint mold 200 is placed on the wafer 100 so that each pair of the first and the second cavities 210 and 220 is placed over a respective one of the wafer portions 110.

Each pair of the first and the second cavity 210 and 220 of the imprint mold 200 is placed over a respective one of the wafer portions 110 such that the light transparent material 130 filled in the first cavity 210 of the respective pair of the first and second cavity of the imprint mold 200 is placed above the respective light detecting area 10 and the light emitter device 30 to form the volume 40 of the light transparent material 130. Furthermore, each pair of the first and the second cavity 210 and 220 of the imprint mold 200 is placed over a respective one of the wafer portions 110 such that the transparent material filled in the second cavity 220 of the respective pair of the first and second cavity of the imprint mold 200 is placed above the respective light detecting area 20 to form the volume 50 of the light transparent material 130.

To form the volumes 40 and 50 of the light transparent material as lenses on the respective surface 111 of each of the wafer portions 110, the imprint mold/master stamp 200 carries the negative shape of the lenses 40, 50 in the form of the first and second cavities 210, 220 in its surface.

The respective surface 211, 221 at the bottom of the first and the second cavity 210, 220 of each pair of the first and second cavity of the imprint mold 200 has a shape so that the first and the second volume 40 and 50 of the light transparent material 130 is formed as a lens. In particular, the respective first cavity 210 of each pair of the first and the second cavity of the imprint mold 200 is shaped such that the volume 40 of the light transparent material 130 is formed having a concave shape to realize a concave lens. Furthermore, the respective second cavity 220 of each pair of the first and the second cavity of the imprint mold 200 is shaped such that the volume 50 of the light transparent material 130 is formed having a convex shape to realize a convex lens.

FIG. 4 shows the wafer configuration after the volume 40 of the light transparent material 130 is placed on the surface 111 of each wafer portion 110 to encapsulate the light emitter device 30 and the light detecting area 10/optical filter 160, and after placing the volume 50 of the light transparent material 130 over the light detecting area 20/optical filter 160 of each of the wafer portions 110.

The transparent material 130 is cured in the first and second cavity 210 and 220 of each pair of the cavities 210, 220 to form the respective first and second volume 40 and 50 of the light transparent material 130. The manufacturing method using the Nano Imprint lithography enables the manufacturing of completely isolated lenses 40 and 50 without the need for runners. In the case of lens forming using wafer-level molding, runner gates need to be removed in an additional process step. However, according to the proposed solution, no portion of the transparent encapsulant 130 has to be removed to form the spatially separated volumes/lenses 40 and 50.

FIGS. 5 and 6 illustrate the manufacturing step of placing the opaque material 60 on the wafer portions 110 in a space 120 between the respective volumes 40 and 50 of the light transparent material 130 of each wafer portion 110. The opaque material 60 is placed on the respective wafer portions 110 of the wafer 100 by a wafer-level molding process. In particular, the wafer-level molding process may be a film assisted wafer-level molding process.

In order to apply the film assisted wafer-level molding process to dispose the opaque compound 60 on the surface 111 of each wafer portion 110, a mold tool 300 having a body 310 which is covered by a soft film 320 is provided. The soft film 320 may be configured as a PTFE-film. As shown in FIG. 5, the mold tool 300 is placed above the wafer 100 such that a respective upper surface 41, 51 of the volume 40 and 50 of the light transparent material 130 is covered by the film 320. The mold tool 300 is placed above the wafer 100 such that a space 120 is provided between the film 320 and the surface 111 of the respective wafer portions 110.

The opaque material 60 is injected in the space 120 between the film 320 and the surface 111 of the respective wafer portions 110 via molding before singulation, i.e. still on wafer-level. The film 320 seals the respective upper surface 41, 51 of the volume 40 and 50 of the light transparent material 130 so that the respective upper surface 41, 51 of the volume 40 and 50 of the light transparent material is kept free of the opaque material 60. The opaque mold 60 is added without the need to form grooves, and without the need to remove the material above the apertures, thus significantly simplifying the method.

The mold tool 300 can have a specific shape to achieve a certain surface geometry of the device. According to a possible embodiment, the mold tool 300 can have a flat surface, as shown in FIGS. 5 and 6, which has the advantage that alignment is uncritical.

FIG. 7 illustrates the manufacturing step of providing external connections 140, for example solder balls, to electrically connect the light detecting areas 10 and 20, the light emitter device 30 and the integrated optoelectronic circuits 70 and 80. The electrical connection can be provided by mounting solder balls 140 to the bottom surface 112 of each wafer portion 110.

In a last manufacturing step the wafer 100 is diced between adjacent ones of the wafer portions 110 to separate the wafer 100 into the plurality of Time-of-Flight sensor devices 1.

LIST OF REFERENCE SIGNS

1 Time-of-Flight sensor device
10 light detecting area
20 light detecting area
30 light emitter device
40 volume of light transparent material
50 volume of light transparent material
60 opaque material
70, 80 integrated circuit
90 through silicon via
100 wafer
110 wafer portion
120 space between volumes of light transparent material
130 light transparent material
140 electrical connection/solder balls
150 die
160 optical filter
170 wire
200 imprint mold
210, 220 cavity of imprint mold
300 mold tool
310 body of mold tool
320 film

The invention claimed is:

1. A method for fabricating a plurality of Time-of-Flight sensor devices, comprising:
    providing a wafer including a plurality of wafer portions for a respective one of the Time-of-Flight sensor devices wherein each of the wafer portions includes a first light detecting and a second light detecting area wherein at least the second light detecting area is arranged in a surface of the respective wafer portion,
    disposing a respective light emitter device on each of the wafer portions, wherein the respective light emitter device and the respective first light detecting area are arranged so that portions of the light emitted by the respective light emitter device are detected by the respective first light detecting area,
    encapsulating the respective light emitter device and the respective first light detecting area by a first volume of a light transparent material and encapsulating the respective second light detecting area by a second volume of the light transparent material, wherein the first and second volume of the light transparent material are separated from each other, by the following steps a)-d):
    a) providing an imprint mold having a plurality of pairs of a first and a second cavity, wherein each pair of the first and the second cavity is associated to a respective one of the Time-of-Flight sensor devices,
    b) filling the first and the second cavity of each pair of the first and the second cavity with the light transparent material,
    c) placing the imprint mold on the surface of each wafer portion of the wafer such that each pair of the first and the second cavity is placed over a respective one of the wafer portions,
    d) curing the transparent material in the first and the second cavity of each pair of the first and the second cavity to form the respective first and second volume of the light transparent material of each Time-of-Flight sensor device,
    wherein the respective first cavity of each pair of the first and the second cavity of the imprint mold is shaped such that the first volume of the light transparent material is formed having a concave shape, and
    wherein the respective second cavity of each pair of the first and the second cavity of the imprint mold is shaped such that the second volume of the light transparent material is formed having a convex shape,
    placing an opaque material on the wafer portions in a space between the respective first and second volume of the light transparent material, and
    dicing the wafer between adjacent ones of the wafer portions to separate the wafer into the plurality of the Time-of-Flight sensor devices.

2. The method of claim 1, comprising:
    providing the wafer of a silicon material,
    providing the wafer portions of the wafer including a respective first integrated circuit coupled to the respective first light detecting area to convert an optical signal of the respective first light detecting area in a first electrical signal,
    providing the wafer portions of the wafer including a respective second integrated circuit coupled to the respective second light detecting area to convert an optical signal of the respective second light detecting area in a second electrical signal.

3. The method of claim 1,
    wherein the respective light emitter device and the respective first light detecting area of each wafer portion are arranged next to each other or on top of each other on the wafer so that the portions of the light emitted by the respective light emitter device are detected by the respective first light detecting area.

4. The method of claim 1, comprising:
    providing the respective first and second volume of the light transparent material on the surface of each wafer portion by a Nano Imprint Lithography process.

5. The method of claim 1,
wherein each pair of the first and the second cavity of the imprint mold is placed over a respective one of the wafer portions such that the light transparent material filled in the first cavity of the respective pair of the first and second cavity of the imprint mold is placed above the respective first light detecting area and the respective light emitter device to form the first volume of the light transparent material and the transparent material filled in the second cavity of the respective pair of the first and second cavity of the imprint mold is placed above the respective second light detecting area to form the second volume of the light transparent material.

6. The method of claim 5,
wherein a respective surface at the bottom of the first and the second cavity of each pair of the first and the second cavity of the imprint mold has a shape so that the first and the second volume of the light transparent material is formed as a lens.

7. The method of claim 1,
wherein the opaque material is placed on the wafer portions of the wafer by a film-assisted wafer level molding process.

8. The method of claim 7, comprising:
providing a mold tool having a body covered by a film,
placing the mold tool above the wafer such that a respective upper surface of the first and the second volume of the light transparent material is covered by the film and the space is provided between the film and the surface of the wafer portions,
injecting the opaque material in the space between the film and the surface of the wafer portions, wherein the film seals the respective upper surface of the first and the second volume of the light transparent material so that the respective upper surface of the first and the second volume of the light transparent material is kept free of the opaque material.

9. The method of claim 8, comprising:
providing the wafer with respective through silicon vias in the material of each of the wafer portions,
mounting solder balls to a bottom surface of each wafer portion of the wafer to provide an electrical connection for each of the Time-of-Flight sensor devices.

10. A Time-of-Flight sensor device, comprising:
a silicon die including a first light detecting area and a second light detecting area being arranged in a surface of the silicone die,
a light emitter device being arranged on the surface of the silicon die in relation to the first light detecting area such that portions of the light emitted by the light emitter device are detected by the first light detecting area,
a first volume of a light transparent material being placed on the surface the silicon die so that the light emitter device and the first light detecting area are encapsulated by the first volume of the light transparent material, wherein a surface of the first volume of the light transparent material is formed so that the first volume of the light transparent material is configured as a concave lens,
a second volume, of a light transparent material being placed on the surface of the silicon die so that the second light detecting area is encapsulated by the second volume of the light transparent material wherein the first and second volume of the light transparent material are separated from each other, wherein a surface of the second volume of the light transparent material is formed so that the second volume of the light transparent material is configured as a convex lens,
wherein an opaque material is disposed in a space between the first and second volume of the light transparent material such that an upper surface of the first and the second volume of the light transparent material is free from the opaque material, wherein the opaque material prevents the second light detecting area from receiving light directly emitted from the light emitter device.

11. The Time-of-Flight sensor device of claim 10 further comprising:
a first integrated circuit coupled to the first light detecting area to convert an optical signal received from the first light detecting area in a first electrical signal,
a second integrated circuit coupled to the second light detecting area to convert an optical signal received from the second light detecting area in a second electrical signal,
wherein the first and the second integrated circuit are embedded in the silicon die,
through silicon vias being provided in the silicon die and filled with an electrically conductive material,
solder balls to electrically connect the first and second integrated circuit via the through silicon vias.

12. The Time-of-Flight sensor device of claim 10,
wherein the light emitter device and the first light detecting area are arranged next to each other or on top of each other on the silicon die so that the portions of the light emitted by the light emitter device are detected by the first light detecting area,
wherein the light emitter device is configured as a VCSEL,
wherein the first and the second light detecting area are configured as two specially separated SPAD arrays,
wherein the light transparent material of the first and the second volume includes a clear epoxy resin or silicone.

* * * * *